(12) United States Patent
Zhang

(10) Patent No.: US 11,440,117 B2
(45) Date of Patent: Sep. 13, 2022

(54) MULTIPLE MODULE CHIP MANUFACTURING ARRANGEMENT

(71) Applicant: Jian Zhang, Brookline, MA (US)

(72) Inventor: Jian Zhang, Brookline, MA (US)

(*) Notice: Subject to any disclaimer, the term of this patent is extended or adjusted under 35 U.S.C. 154(b) by 279 days.

(21) Appl. No.: 16/602,396

(22) Filed: Sep. 27, 2019

(65) Prior Publication Data

US 2021/0098401 A1    Apr. 1, 2021

(51) Int. Cl.
  *B23K 3/00*   (2006.01)
  *B23K 3/047*  (2006.01)
  *H01L 23/00*  (2006.01)
  *H01L 21/68*  (2006.01)
  *H01L 21/687* (2006.01)
  *B23K 3/06*   (2006.01)

(52) U.S. Cl.
  CPC .......... *B23K 3/047* (2013.01); *B23K 3/0623* (2013.01); *H01L 21/681* (2013.01); *H01L 21/68707* (2013.01); *H01L 24/11* (2013.01); *H01L 24/13* (2013.01); *H01L 24/742* (2013.01); *H01L 24/75* (2013.01); *H01L 24/81* (2013.01); *H01L 2224/117* (2013.01)

(58) Field of Classification Search
  CPC .. B23K 3/047; B23K 3/0623; B23K 35/0244; H01L 21/681; H01L 21/68707; H01L 24/11; H01L 24/13; H01L 24/742; H01L 24/75; H01L 24/81; H01L 2224/117; H01L 21/68742; H01L 21/6838
  USPC ...................... 228/41, 56.3, 245–246, 180.22
  See application file for complete search history.

(56) References Cited

U.S. PATENT DOCUMENTS

| | | | | |
|---|---|---|---|---|
| 5,302,209 A | * | 4/1994 | Maeda ................ | C23C 16/4584 156/345.55 |
| 5,467,913 A | * | 11/1995 | Namekawa .......... | B23K 3/0623 228/41 |
| 5,788,143 A | * | 8/1998 | Boyd ................ | H01L 21/67144 228/253 |
| 6,056,190 A | * | 5/2000 | Foulke ................ | H01L 21/4853 228/56.3 |
| 6,413,850 B1 | * | 7/2002 | Ooroku ................ | H01L 24/11 438/615 |
| 6,575,351 B1 | * | 6/2003 | Kobayashi .......... | B23K 3/0623 228/246 |
| 6,827,789 B2 | * | 12/2004 | Lee ................ | H01L 21/68785 156/345.31 |
| 7,617,962 B2 | * | 11/2009 | Kajii .................... | B23K 3/0623 228/19 |
| 9,226,407 B2 | * | 12/2015 | Zhang .................... | B23K 3/08 |

(Continued)

FOREIGN PATENT DOCUMENTS

| | | | | | |
|---|---|---|---|---|---|
| JP | 2006019417 A | * | 1/2006 | ............ | H01L 24/75 |
| KR | 101141921 B1 | * | 5/2012 | | |
| WO | WO-2020069294 A1 | * | 4/2020 | ....... | H01L 21/67103 |

*Primary Examiner* — Kiley S Stoner
(74) *Attorney, Agent, or Firm* — Don Halgren

(57) ABSTRACT

A unitary wafer assembly arrangement for the application of solder balls onto a substrate for subsequent use in the electronics industry. This wafer tool assembly comprises a number of modules connected to one another and all serviced by a robotic arm to transfer processed wafers from one module to another. The tool assembly comprises a load port and pre-aligner module, a binder module, a solder ball mount module and a reflow module. A wafer inspection and repair module arrangement is also part of the tool assembly.

10 Claims, 15 Drawing Sheets

(56) References Cited

U.S. PATENT DOCUMENTS

| | | | | |
|---|---|---|---|---|
| 2001/0007330 A1* | 7/2001 | Kajii | ............... | B23K 3/0623 |
| | | | | 228/103 |
| 2001/0015372 A1* | 8/2001 | Yamamoto | ......... | B23K 3/0623 |
| | | | | 228/41 |
| 2002/0185523 A1* | 12/2002 | Dordi | ............ | H01L 21/67225 |
| | | | | 228/33 |
| 2003/0213832 A1* | 11/2003 | Kang | ............. | B23K 1/206 |
| | | | | 228/180.22 |
| 2004/0056078 A1* | 3/2004 | Kee | ............ | B23K 1/018 |
| | | | | 228/41 |
| 2005/0245003 A1* | 11/2005 | Noda | ............ | H01L 23/5227 |
| | | | | 257/E23.04 |
| 2006/0219755 A1* | 10/2006 | Kajii | ............. | B23K 1/206 |
| | | | | 228/33 |
| 2010/0051671 A1* | 3/2010 | Ling | ............. | B23K 3/0623 |
| | | | | 228/103 |
| 2014/0151437 A1* | 6/2014 | Choi | ............ | H01L 24/81 |
| | | | | 228/8 |
| 2015/0034699 A1* | 2/2015 | Zhang | ............. | H01L 21/6719 |
| | | | | 228/47.1 |
| 2015/0034702 A1* | 2/2015 | Zhang | ............. | H01L 21/6719 |
| | | | | 228/176 |
| 2015/0097024 A1* | 4/2015 | Kurihara | ............. | B23K 1/203 |
| | | | | 228/41 |
| 2019/0043745 A1* | 2/2019 | Zhang | ............. | H01L 21/67253 |
| 2020/0043759 A1* | 2/2020 | Zhang | ............. | H01L 21/68742 |

* cited by examiner

MULTIPLE MODULE CHIP MANUFACTURING ARRANGEMENT

BACKGROUND OF THE INVENTION

The present invention relates to assemblies and subassembly modules for the manufacture of wafer chips or substrates with solder balls or plated solder balls (which may also be called bumps attached thereto), and more particularly to devices for processing wafers with a flux less or flux free binder in a connectable arrangement of treatment modules intermatingly adaptable to changing conditions of such wafer chip manufacture. For discussion here, plated solder balls, solder balls, bumps and the like will all be designated "solder balls" to avoid confusion.

This application is the Non Provisional filing of Provisional application No. 62/766,076, filed 28 Sep. 2018, which is incorporated herein in its entirety, and which present application of relates to provisional application No. 62/605,288 filed on 7 Aug. 2017, where, prior to a solder ball arrangement being heat processed in a flux free solder reflow or solder ball join arrangement, which arrangement is then described in a sister provisional application 62/605,277 filed 7 Aug. 2017, the US patent applications are Ser. Nos. 15/998,298, and 15/998,295, respectively, both filed on 1 Aug. 2018, each of which provisional application and their respective subsequent non-provisional application(s) is/are incorporated herein by reference in their entirety.

BRIEF SUMMARY OF THE INVENTION

The present invention relates to an arrangement of individual modules which taken together comprise a system for the manufacture of wafer chips with solder balls arranged thereon. The modules within the system are each designed to promote the efficient manufacture of that component of the chip assembly needed for the completion.

For marketing purposes, the assembly may be called herein by a trade name, the "Symphony" chip assembly arrangement or tool.

The Symphony chip assembly tool comprises a front end module (EFEM), a binder application module, a solder ball mount module (SBM), an inspection and repair module, and a reflow module. A robotic arm is arranged in the front end module to move wafers between the respective modules and a pre-aligner for course wafer arrangement. A further embodiment of the Symphony tool assembly comprises a side by side arrangement of multiple reflow modules. A front end module (EFEM) is may also be arranged adjacent the multiple reflow modules to permit their servicing in parallel so as to increase the throughput of the reflow process. A yet a further embodiment of the Symphony assembly, comprises a dual solder ball mount module configuration, arranged to increase the throughput of the ball mount step. Such further dual solder ball mount configuration comprises a front end module (EFEM), with two solder ball mount (SBM) modules for processing in parallel thereadjacent, a binder application module, and an inspection module. A still yet a further embodiment of the Symphony tool assembly, comprises a single reflow module configuration with its attendant front end module (EFEM) servicing that single reflow module.

The invention thus comprises a unitary wafer or chip assembly arrangement or tool for the application of solder balls onto a wafer substrate for subsequent use in the electronics industry, the wafer assembly arrangement comprising: an arrangement of individual wafer treatment modules interconnected to and serviced by a central wafer handling robot; the modules including a pre-aligner module for receipt of wafers to be treated, a binder module of the application of a fluid binder onto an upper surface of the wafer, a solder ball mount module for the application of a plurality of solder balls onto the wafer, a reflow module for the heating and securing the solder balls onto an arrangement of pads on the wafer, and an inspection module with a review and analysis and, if needed, a repair arrangement for solder balls deposited upon the wafer. The fluid binder is applied to the wafer by a nozzle arrangement supported on a gantry movably disposed over a wafer supported thereunder. A plurality of solder balls are disposed as an array, onto a spaced pattern of solder ball engagement locations on the wafer after the solder balls having been filtered through a vertical array of foraminous solder ball alignment plates movably disposed above the wafer. An air knife is driven transversely across the array of solder balls on the surface of the wafer so as to displace any extraneous solder balls from the surface of the wafer. Extraneous solder balls are passed to a one-way channel for collection and subsequent reuse on a further wafer.

The invention also comprises a process for the manufacture of a chip assembly in a unitary wafer assembly system, for use in the electronics industry, comprising the steps of: removing a wafer from front opening by a robot wherein the wafer is delivered to pre-aligner for centering; transferring the wafer to a binder station by the robot wherein binder fluid applied to wafer; taking the wafer by the robot to a solder ball mount station on a chuck to a first wafer service position opening; aligning the wafer by a camera arrangement for subsequent orientation of wafer with stencil hole pattern; transferring the wafer to a second wafer service position opening where a stencil resides; moving a wafer support chuck upwardly to lift the wafer very close to stencil, a distance less than solder ball diameter; verifying wafer alignment by a camera verification arrangement on an overhead solder ball head as part of a movable gantry, by viewing the wafer through the stencil to identify fiducial marks on wafer; moving the solder ball head, once wafer alignment has been verified, into proper position over the wafer; dispensing solder balls from a solder ball reservoir on the solder ball head, through funnels to a distribution cup, then to a distribution plate to fall through a plurality of perforated plates; dropping solder balls onto a perforated stencil; bringing the solder ball head close to stencil; activating the solder ball head to place a brush over the stencil; moving a brush across the wafer fore and aft, without touching the wafer to push solder balls into any remaining holes in the wafer; blowing compressed dry air by an air knife on gantry across the stencil so as to reclaim any non-loaded solder balls into a vacuum enabled collection chamber for subsequent reuse; lowering chuck and wafer in the solder ball mount module for robotic pickup; delivering the solder ball laden wafer to a solder ball inspection and/or repair station; delivering robotically of the solder ball laden wafer to a chuck in the load lock station/first chamber in the reflow module and purging of oxygen from the first station; holding the wafer on the chuck by a vacuum, and rotatably advancing the chuck to a second station for preheating; raising the wafer up through the chuck on elevators to a ring, at the top of the chamber of the second station to reach the highest pre-melt reflow temperature; lowering the wafer by the elevator through the chuck, to return to the wafer of rest on the chuck so as to enable the wafer to reach a controlled reflow temperature, wherein the wafer is then rotated to a third station in the reflow module; separating the wafer from the chuck by a vacuum plate, wherein the wafer is cooled by nitrogen below the plate and above the wafer, a wherein a vacuum transmitted through the chuck holds the wafer flat thereon; and rotating the chuck back to the first station for the unloading of a finished wafer.

BRIEF DESCRIPTION OF THE DRAWINGS

The objects and advantages of the present invention will become more apparent when viewed in conjunction with the following drawings, in which.

DETAILED DESCRIPTION OF THE INVENTION

Figure 1:
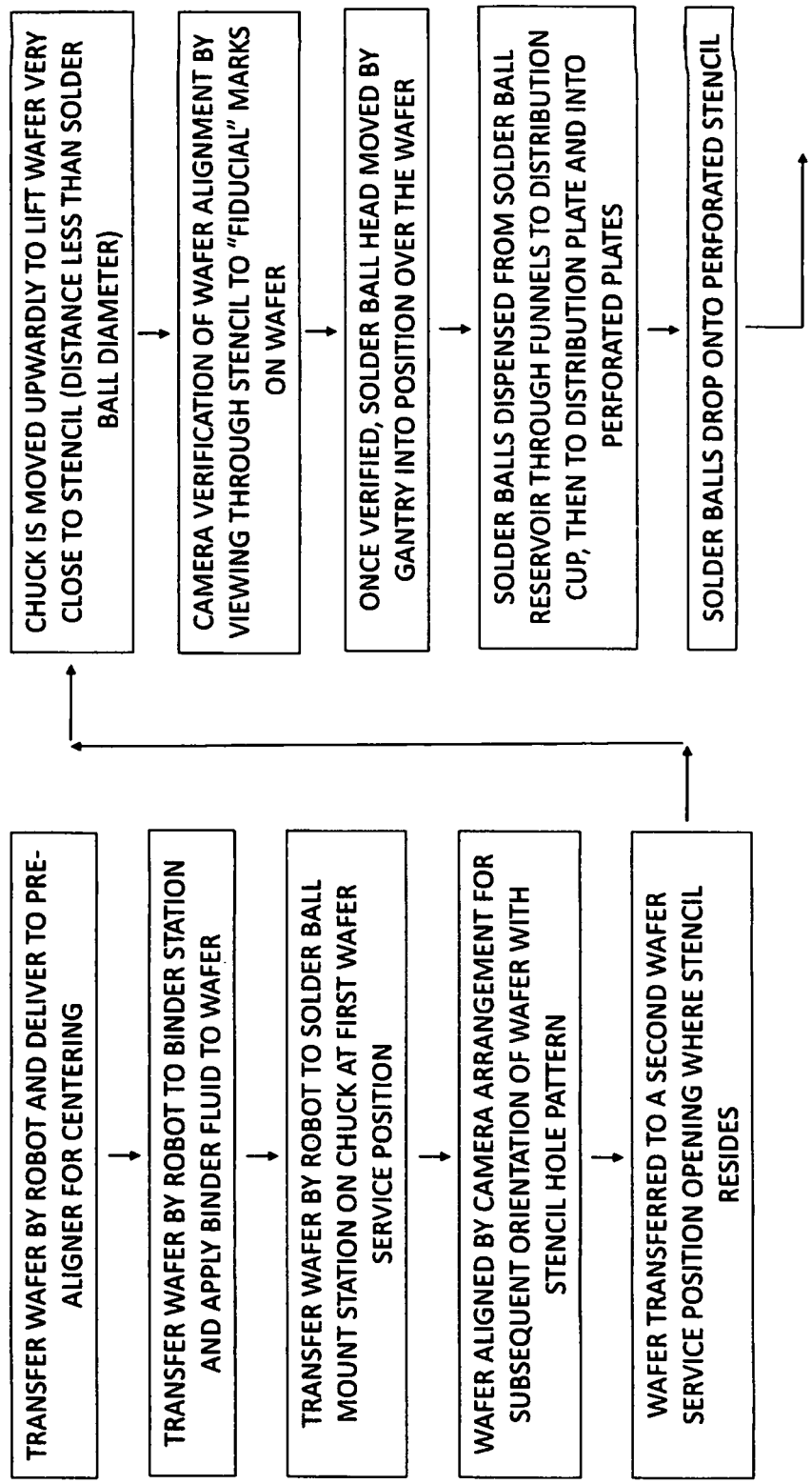
FIG. 1 is a recitation of the steps that the apparatus of the present invention processes to produce a proper chip with electronics industry.
Figure 1:
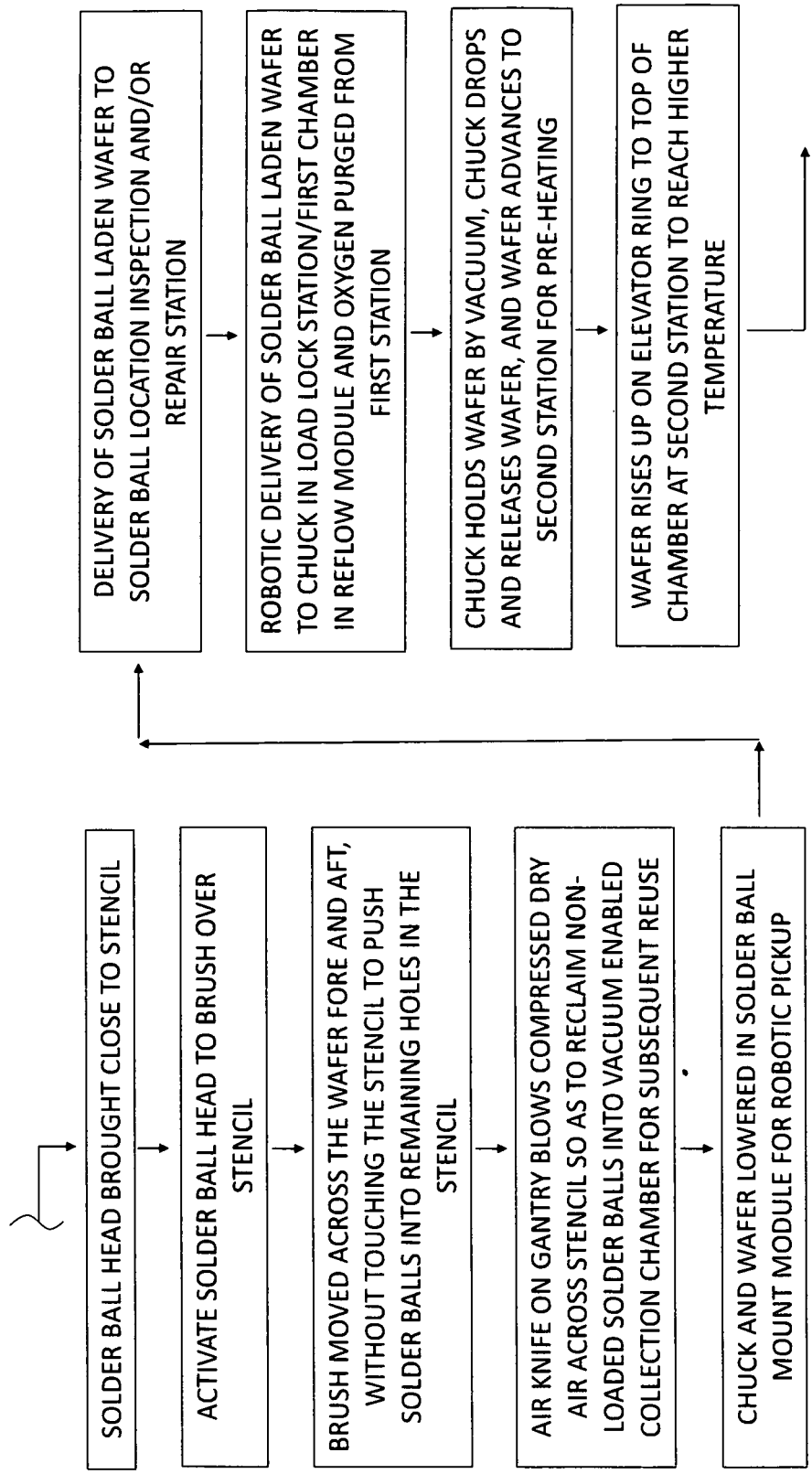
Figure 1:
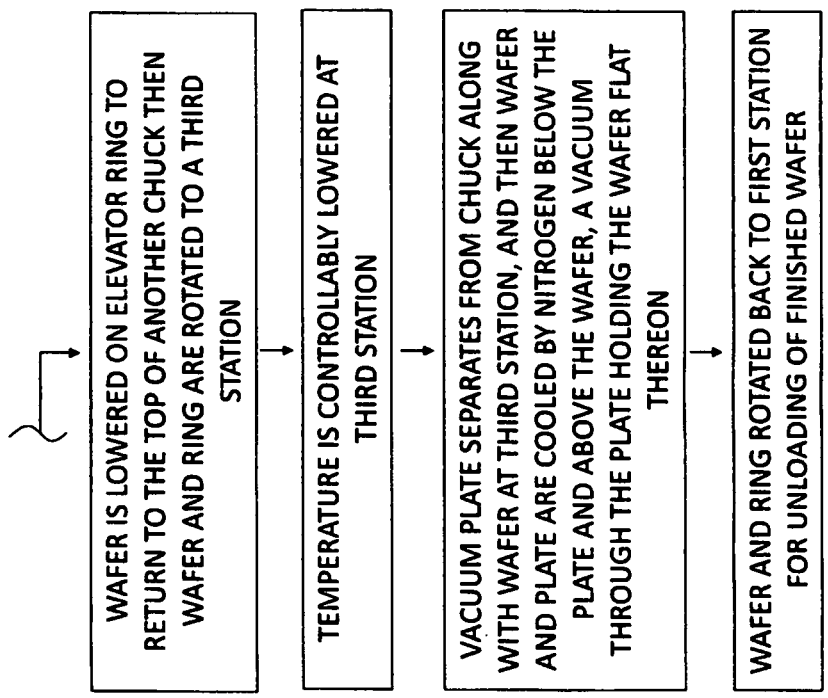

The disclosure in its general aspects comprises an apparatus and the process of that apparatus for the treatment of a wafer for use in the electronics industry, is as follows: a wafer to be treated is removed from the raw wafer stacking by a robotic arm; the wafer is delivered to a pre-alignment station where it is centered on a carrier; wafer is brought to a station in an adjacent binder module; a fluid binder is applied to the wafer; the wafer is then removed by the robotic arm to a solder ball mount station module; wafer is aligned by cameras in the first support opening so as to orient in the line the wafer with a stencil hole pattern; the wafer is brought to a second support opening the solder ball mount module with the stencil resides; a chuck is moved upwardly to support the wafer in a very close position beneath the stencil, (the distance between the wafer and the stencil is less than the diameter of a solder ball), solder balls are dropped from a reservoir into a cup and perforated plate distribution arrangement in the solder ball mount module, the solder balls fall through the perforated plate arrangement and into holes of a stencil for alignment onto a wafer there beneath, the ball loaded wafer being brushed and treated with compressed dry air effects placement of the solder balls and removal of excess solder balls from the wafer, the wafer being carried to a reflow station for final heat treatment and cooling of the solder ball loaded wafer. Such apparatus and process treatment is recited more specifically in FIG. 1.

Figure 2:
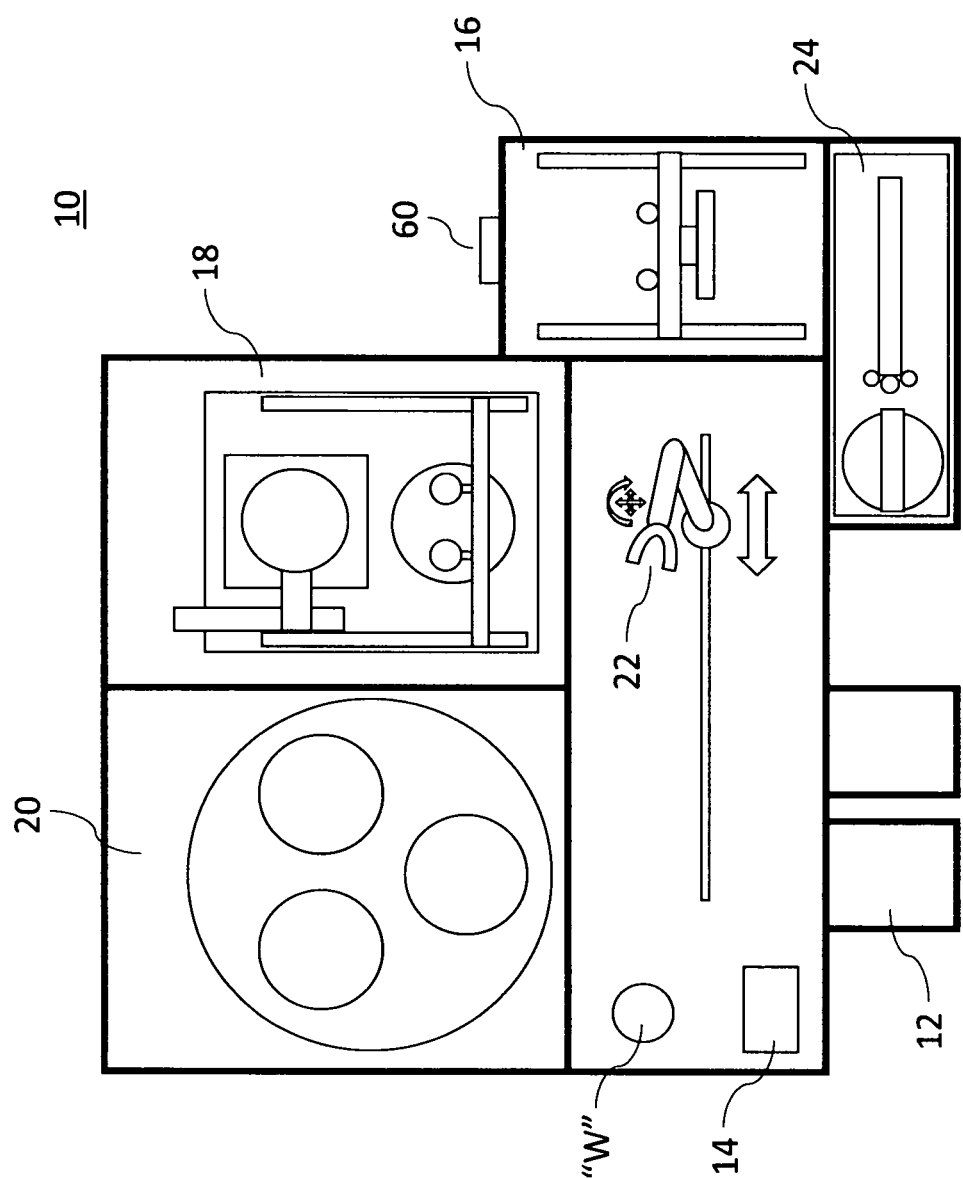
FIG. 2 is a plan schematic view of an assembly tool arrangement, also showing the robotic arm arrangement for transferring wafers from station to station within the assembly tool assembly.
Figure 3:
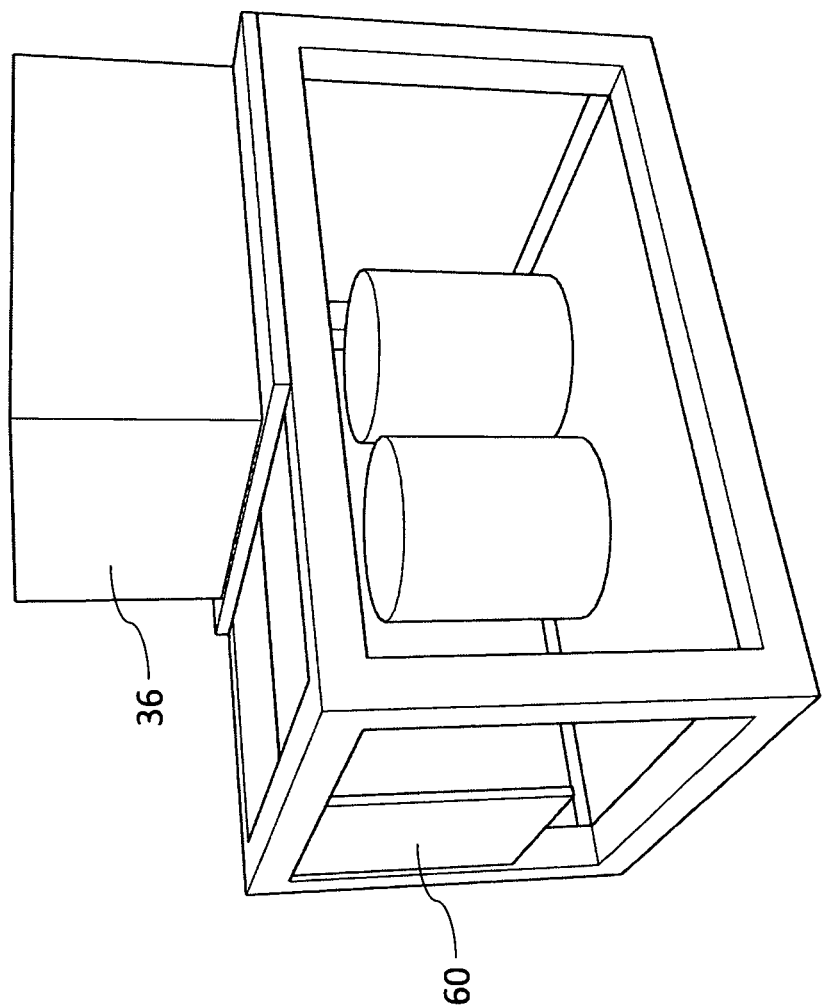
FIG. 3 is a perspective view of the binder module for the application of binder fluid to a wafer undergoing construction.

Referring now to the drawings in detail and particularly to FIG. 2, there is shown a schematic representation of a configuration of the unitary chip assembly tool 10. The chip assembly tool 10 comprises a load port 12, a pre-aligner module 14, a binder module 16, a solder ball mount module 18 and a reflow module 20 each of which are serviced by the sequential loading and unloading by a central robotic arm arrangement 22. The binder module 16 is shown in FIG. 3 in a perspective view, and in FIG. 4 in a side elevational view. An inspection module 24 is also shown in FIG. 2, which inspection module may include an inspection plus arrangement or repair of improperly loaded wafers, disclosed more specifically in FIG. 9C.

Figure 4:
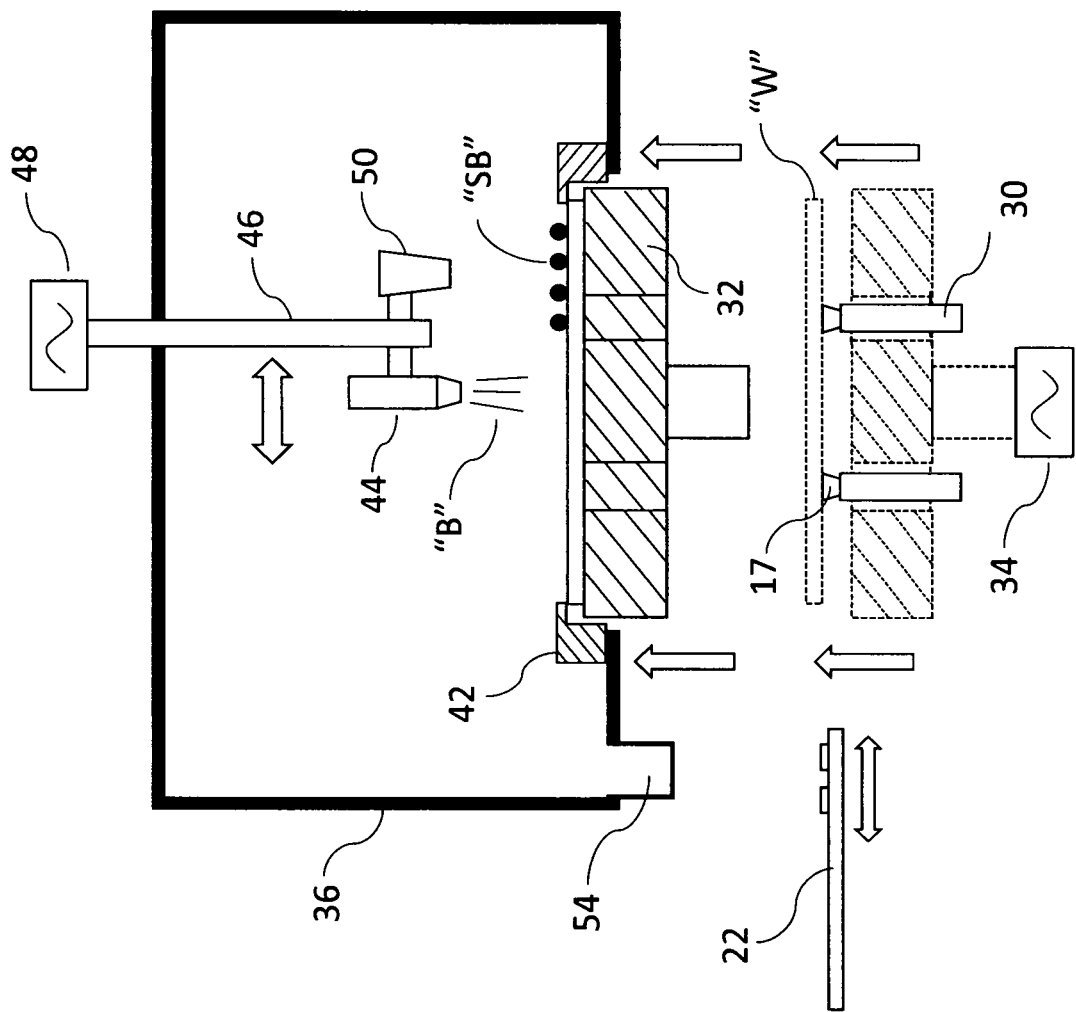
FIG. 4 is a side elevational view in section, of the binder application chamber shown in FIG. 5.
Figure 5:
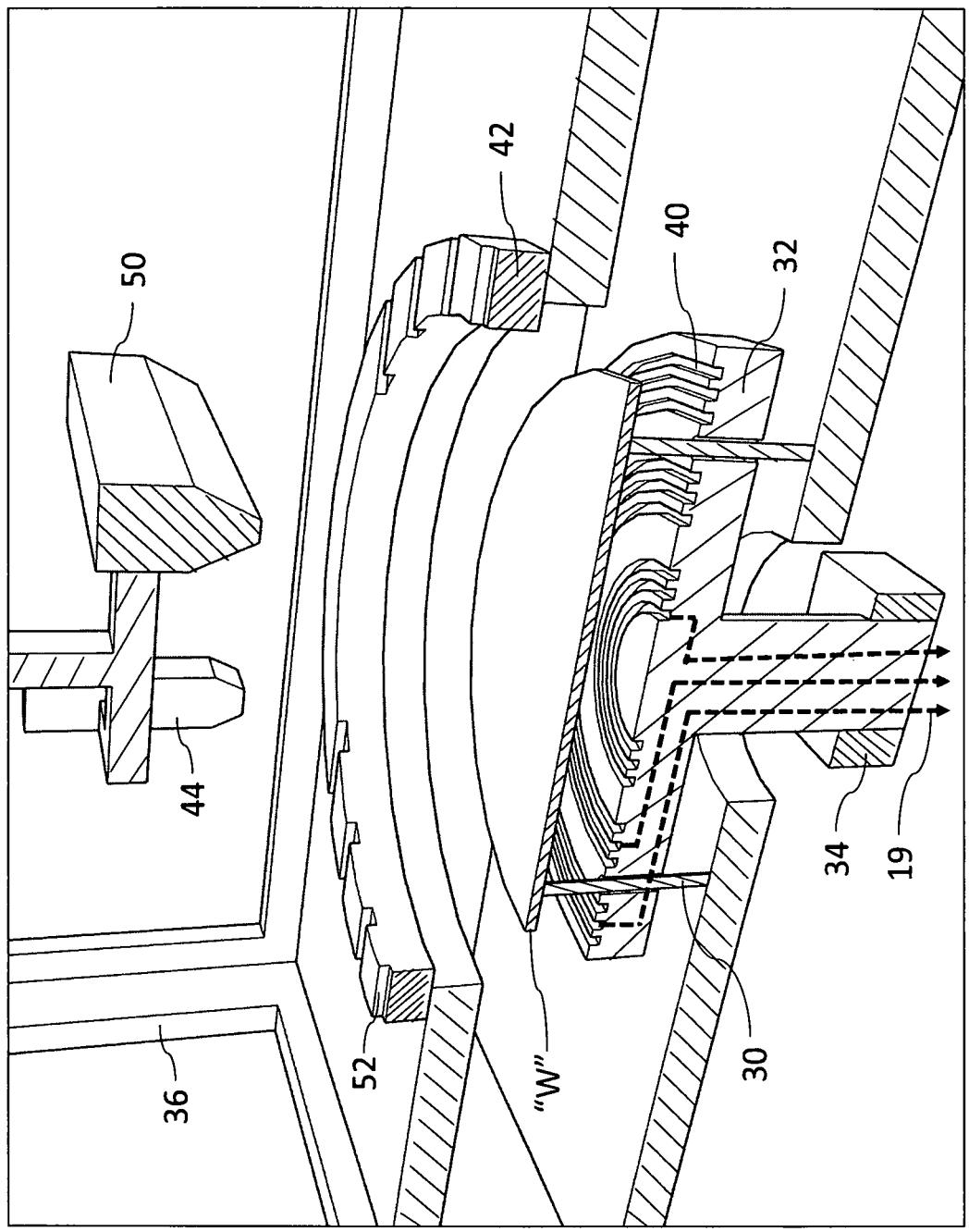
FIG. 5 is a perspective view in section of a wafer support plate or chuck for the lifting of a wafer thereon into the binder application enclosure.

The operation of the chip assembly tool 10 as shown in FIG. 2, is begun at the load the port wherein a wafer "W" is taken from a front opening unified pod (FOUP) and transferred to the binder module 16. A robotic arm 22 effector places the wafer "W" on support pins 30 as represented in FIG. 4. These support pins 30 have vacuum cups 17 at their tips to hold the wafer "W" after has been placed on by the robotic arm 22 onto a vacuum support chuck 32 as represented in FIG. 5, which chuck 32 is then raised, driven by a pneumatic actuator 34, to lift the wafer "W" into the binder application enclosure 36 as shown in FIGS. 4 and 5. The support pins 30 are buried just below the surface of the support chuck 32 and rise up with the plate 32 as it is raised. As the support chuck 32 rises, it engages the wafer "W" and holds it tight against the support chuck 32 by using a vacuum 19 through the support chuck 32. The support chuck 32 has three independently controlled vacuum zones, each comprised of and defined by a series of vacuum channels 40, best seen in FIG. 5. Besides holding the wafers W, the multizone design enables the chuck 32 to flatten and hold a warped wafer. As the support chuck 32 reaches the top of the stroke it engages with a clamping ring 42 shown in FIG. 4, which ring 42 acts as a hard stop. The inner edge of the clamp ring 42 presses on outer edge of the wafer W and forms a liquid tight seal. Liquid binder "B" is dispensed, as representative in FIG. 4, by one or more nozzles 44 as shown in FIG. 4 which nozzles 44 scan across the wafer "W" one or more times. The nozzles 44 evenly distribute a fluid binder "B", by spraying it in a fan pattern approximately normal to the scan direction. The nozzles 44 are carried on a gantry 46 as shown in FIG. 4 which gantry motion is driven by computer-controlled linear actuator with a belt drive 48 as shown in FIG. 4. After depositing the binder B, an air knife 50, as shown in FIG. 4 scans over the wafer, jetting a curtain of compressed dry air thereon. The force of the compressed dry air spreads and thins the binder deposit, leaving behind a uniform film on the wafer. The air knife 50 is mounted on the same gantry frame 46 as the nozzles 44 and though the scanning motions of the two systems are mechanically coupled they are controlled independently of one another and may operate simultaneously or at different times. The air knife 50 also sweeps excess binder "B" off of the wafer. The excess binder makes its way across the clamp ring 42 through channels 52 in the top of the ring 42, best seen in FIG. 5, and down into a collection basin 54 shown in FIG. 4. The binder drains towards on one side where it is channeled toward a drain port which drain port is connected to a collector where the excess binder is stored for eventual reuse. After application of the binder, the vacuum support chuck 32 drops, and the vacuum on the chuck 32 and support pins 30 turns off and the robot 22 removes the wafer "W" from the binder module 16. The height, spacing and angles of the binder dispensing nozzles can be manually adjusted. Different lengths and spacings may be used to optimize the distribution pattern of the binder. The height and angle of the air knife 50 can also be manually adjusted. The volume of the binder dispensed is controlled by the dispensed time, reservoir tank pressure and manual knobs on the nozzles themselves. The compressed dry air flow rate through the air knife 50 is controlled by the combination of mass flow controllers and orifices in the facility panel 60, represented in FIG. 3. Bringing the air knife 50 closer to the surface of the wafer "W" concentrates the force of the air curtain, generally resulting in a thinner binder film. The air knife 50 is also used to clean wafers which may have missing or misaligned solder balls. The air knife 50 blows off all solder balls SB in excess binder from the wafer "W". The binder enclosure 36 is exhausted so that any binder material which remains airborne does not escape and contaminates of the part of the tool assembly.

Figure 6:
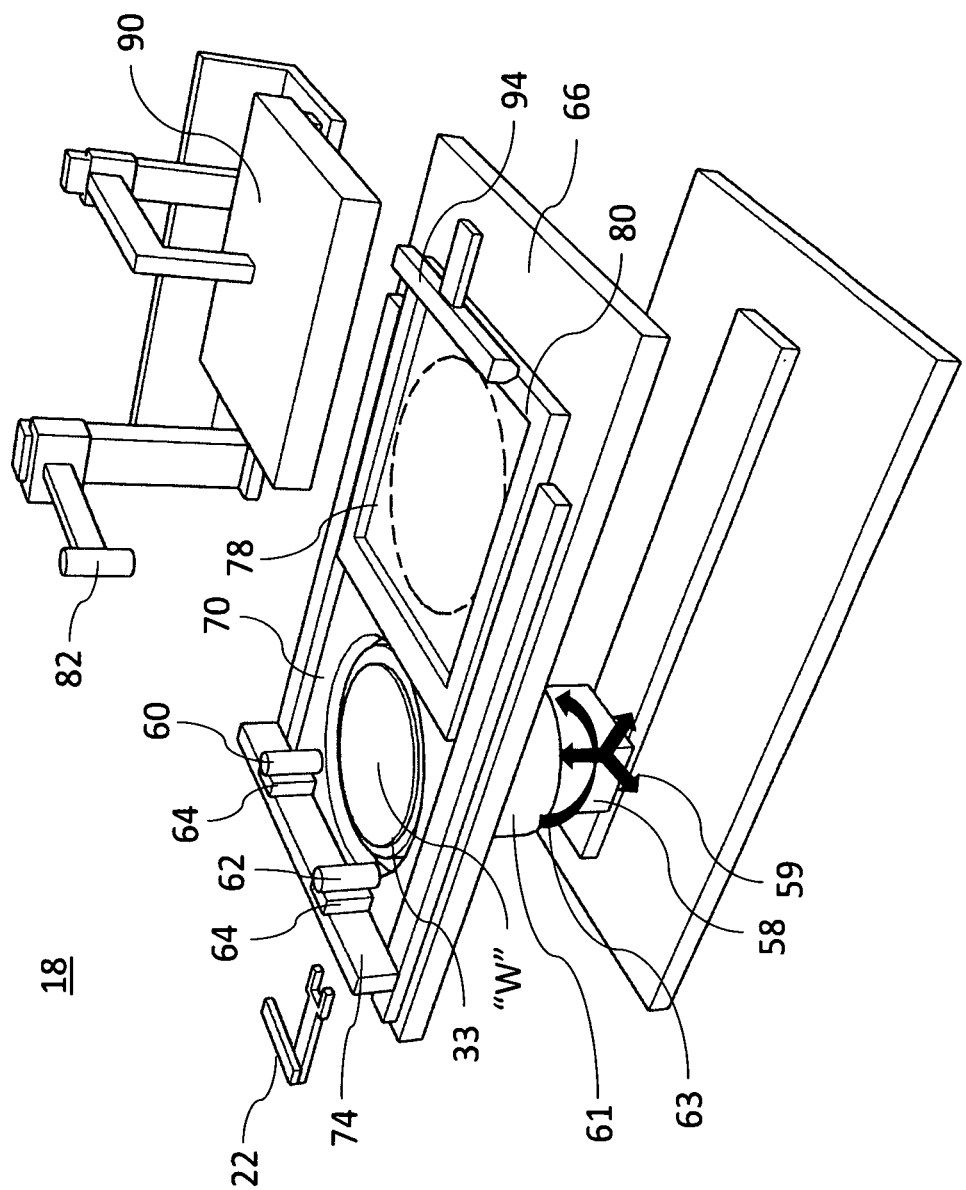
FIG. 6 is a perspective view of a solder ball mount module showing a robotic arm for feeding wafers to the solder ball mount module, and its associated optic inspection arrangement.
Figure 7:
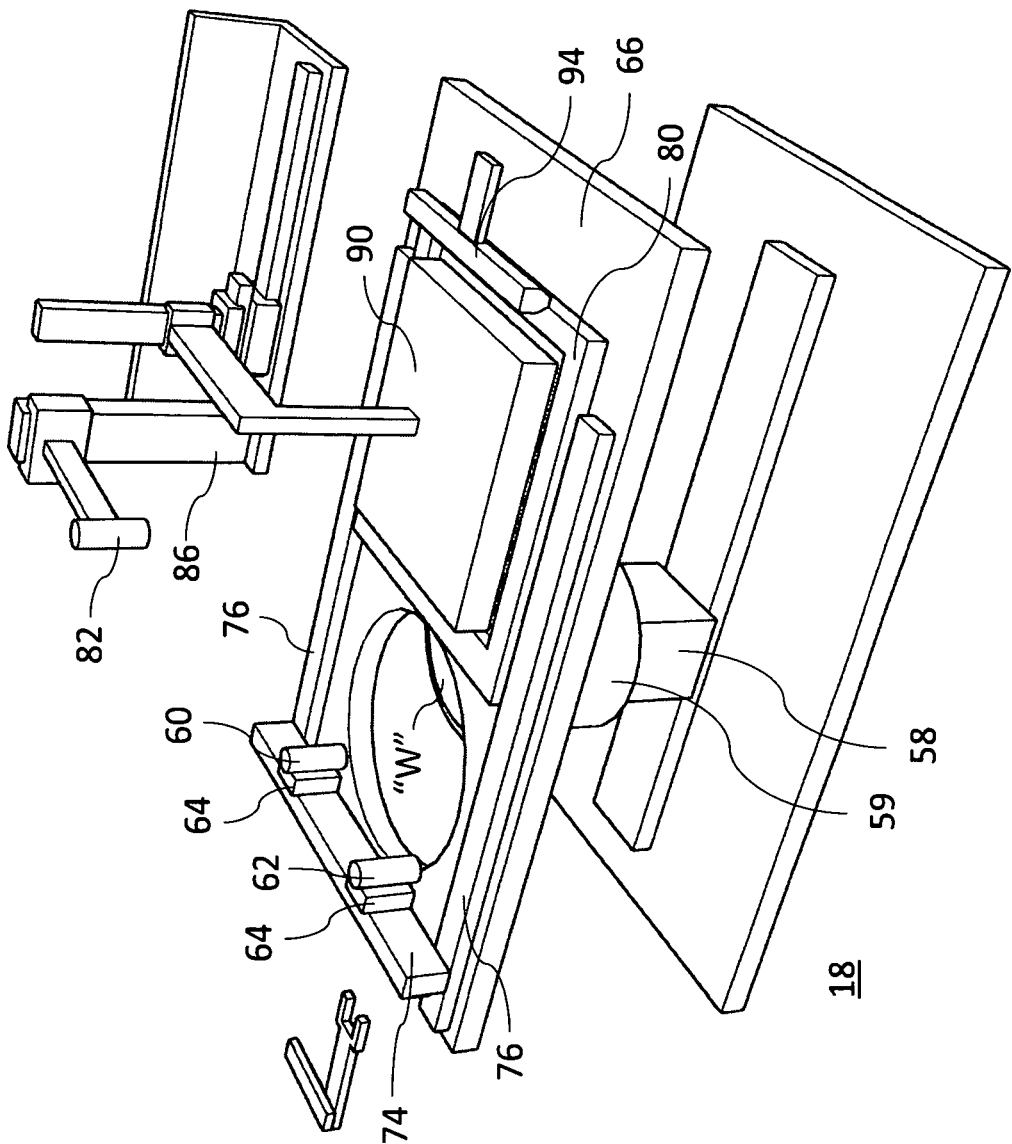
FIG. 7 is a perspective view of the solder ball mount with the inspection optics and the camera arrangement showing a gantry arrangement.

The operation of the chip assembly tool 10 continues with the removal of the wafer "W" by the robotic arm 22 which is represented in FIGS. 2 and 6, and is roughly aligned in the pre-aligner 14. It is then transferred to the solder ball mount module 18 for optical alignment of the solder balls SB on the wafer "W", as represented in FIGS. 6 and 7. The wafer vacuum support chuck 33 starts in the load position as it accepts the wafer from the robotic arm 22. The support chuck 33 has support pins with vacuum cups 17, as shown in FIG. 4. There are several sets of independently controlled the vacuum channels 40 or zones in the surface of the support chuck 32; where those channels or zones 40 are connected to properly actuated vacuum lines 19, as shown in FIG. 4. The wafer "W" is first loaded onto the support pins and secured with the vacuum cups. The pins recess into the vacuum support chuck 33. This lowers the wafer to the surface of the chuck 33 where it is held by the vacuum zones. The stages 58 are actuated in the X, Y, and Z directions by linear actuators with push precision ball screws as represented in FIG. 6 by arrows 59. A high precision turntable stage 61 also rotates the wafer "W" in the theta direction, as indicated by arrow 63 in FIG. 6. All wafer stage motions are computer-controlled through a proper circuit. The wafer stages then moves the support chuck 33 with the wafer into the alignment window cutout 70 in the upper mounting plate 66, as shown in FIG. 6. Two downward looking cameras 60 and 62, shown in FIGS. 6 and 7 are stationed above the wafer "W" such that each camera is looking at a different predetermined location on the wafer. Each camera 60 and 62 is mounted to an independently operated linear drive 64, with a transverse orientation with respect to the mounting plate 66. Both actuators are, in turn, mounted on the gantry frame 74 shown in FIGS. 6 and 7, which gantry 74 can be actuated along the longitudinal axis of the mounting plate using one or two precision ball screw actuators 76, wherein each camera 60 and 62 takes an image of a small portion of the wafer "W" and the proper computer, not shown, uses this information to determine the exact location of the wafer in the X, Y and theta configuration. The stages moves the wafer down, over and up through the second stencil window 78 in the mounting plate 66 as shown in FIG. 6. The stage Z motion raises the wafer "W" so that its upper surface just touches or fits slightly below the bottom surface of the stencil 80. The computer-controlled system already knows the exact orientation of the stencil 80 and in combination with its knowledge of the wafer orientation, can position the wafer so that it is aligned to the stencil 80 with a high degree of accuracy before bringing it up in the Z direction. Verification camera 82 is shown in FIG. 7 is arranged to confirm the final arrangement of the wafer "W" relative to the stencil 80. By using a pneumatic actuator 86, represented in FIGS. 7 and 8, the verification camera 82 moves down to bring the stencil 80 and wafer "W" into focus. The verification camera 82 moves up to get a clear of the subsequent operation of the ball brush head 90.

Figure 7A:
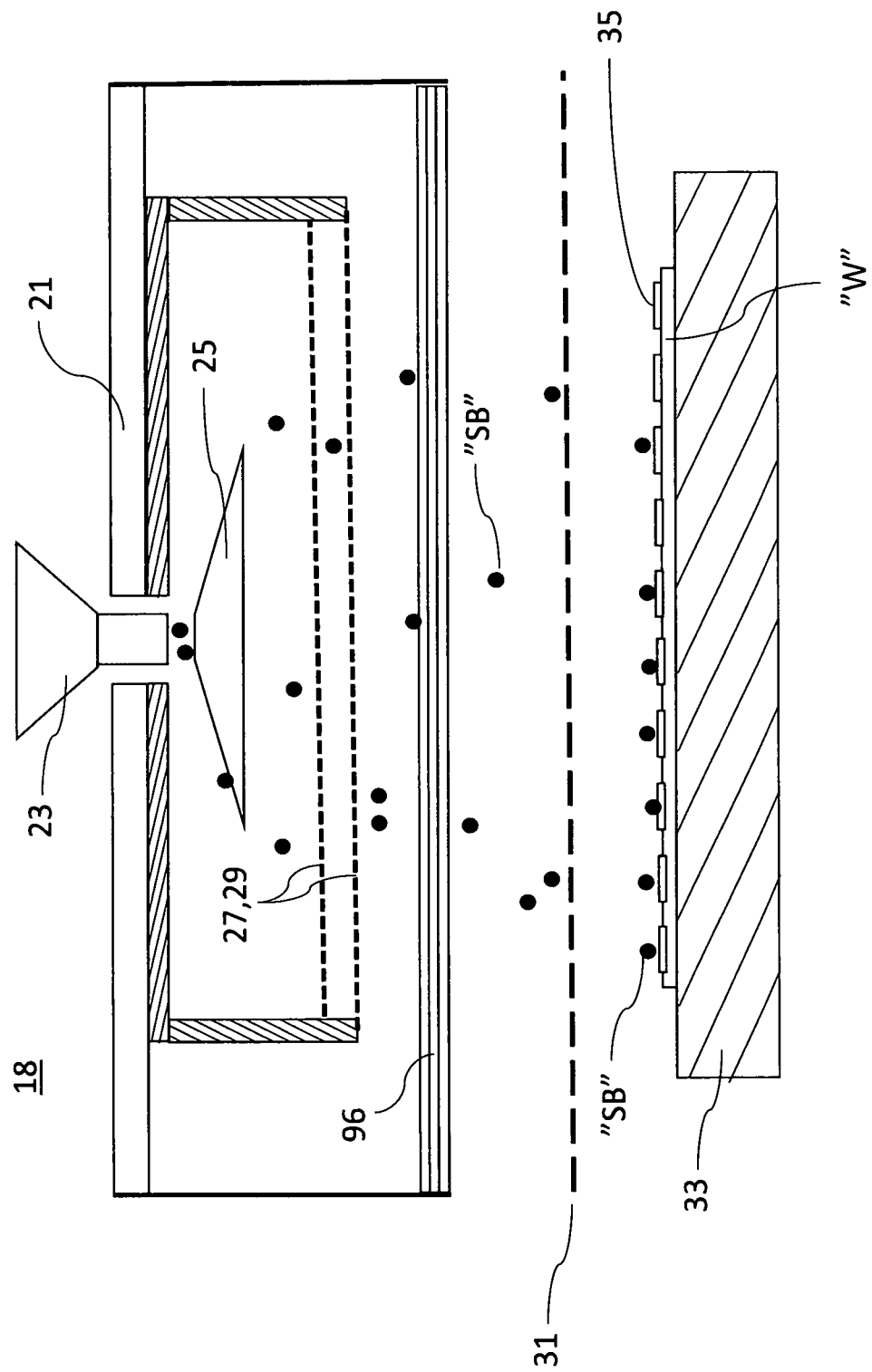
FIG. 7A is a side elevational view of a brush head showing a distribution of solder balls onto a primary distribution plate and several secondary distribution plates thereunder with a sweeper arrangement attached to the bottom of the brush head, with a stencil shown therebeneath spaced above a wafer supported on a chuck.
Figure 8:
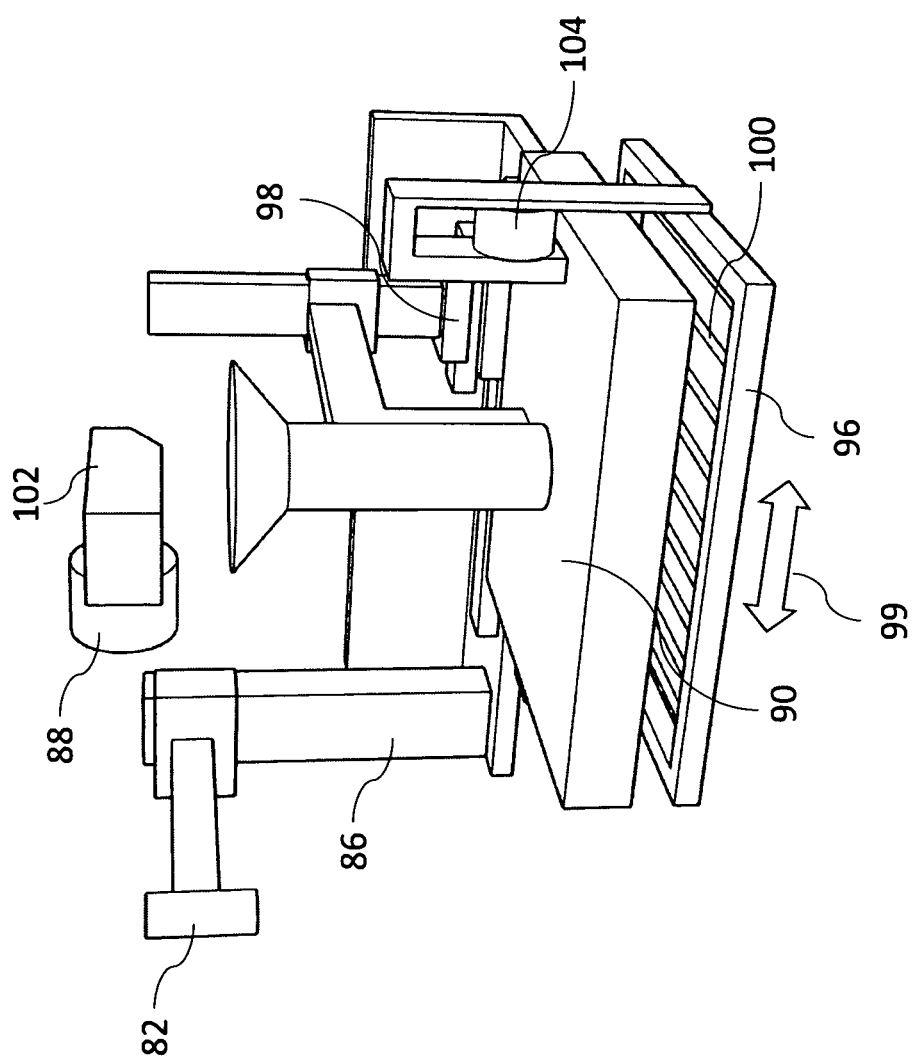
FIG. 8 is a perspective view of the topside of the brush head arrangement.

The operation of the chip assembly tool continues as the solder ball brush head 90, moves into position over the stencil 80 and is lowered into the dispensing position and very lightly contacts the stencil 80. A rotary pneumatic member 88, shown in FIG. 8, tilts the reservoir 102 and releases a predetermined volume of solder balls SB onto a primary distribution plate 25, as shown in FIG. 7A. The solder balls SB then move down through holes in several levels of secondary distribution plates 27 and 29, and spread out further before finally being dispersed over the surface of the stencil 80. A ball brush head 90 represented in FIG. 8 is driven by an pneumatic actuator 98. The brush head 90 contains a series of sweeping members 100, such as wires, or pressurized perforated tubes with the perforations along their lower under side, or the like, the sweeping members 100 being shown in FIG. 8, which are amounted to the underside of the ball brush head 90 and such they protrude downwardly and make slight contact. When the sweeping members 100 are wires, they are placed under slight tension so that a portion of each wire shown is drawn straight, parallel to the surface of the stencil 80. Straight portions of each sweeping member wire 100 span a distance greater than the diameter of the wafer "W" being processed. Keeping the wire 100 parallel with the stencil surface ensures uniform spacing between the wire 100 and the stencil 80. The gap, if any, between the wire in the stencil can be controlled such that the solder balls SB are retained between each pair of wires that do not pass underneath freely. Once the ball brush head 90 has been lowered, a computer-controlled electromagnetic vibrator 104, shown in FIG. 8, drives the sweeping arrangement 96 with a small oscillatory motion parallel to the plane of the stencil 80 and perpendicular to the axis of the wires or tubes 100, the small amplitude of the vibratory motion is designed to move the solder balls SB over small distances between the wires or pressured air tubes 100 without scratching the stencil 80. While vibrating, the ball brush head 90 [96] also translates back and forth parallel to the stencil 80 and perpendicularly to the wires or tubes 100 with a limited gross motion as indicated by arrow 99 in FIG. 8, to ensure that any point of the stencil 80 will be swept by a vibrating wire or pressurized tubes 100. Translating the sweeping member wires or pressurized tubes 100 also ensures no holes in the stencil 80 are covered the entire duration of the spreading operation which might prevent solder balls from filling those blocked holes. After spreading the solder balls SB, the holes in the stencil 80 should each contain one solder ball SB to be left upon a pad on the wafer once the wafer and the stencil are separated from one another. There may be extra solder balls SB on the stencil 80 which have not filled holes and these extra or excess solder balls need to be cleared before the wafer is lowered. The ball brush head 90 moves up out of the way and an air knife 50, shown in FIG. 4, sweeps over the stencil 80 and pushes all extra solder balls SB to the backside of the stencil 80. Flow of air from the air knife 94 is strong enough to sweep away all solder balls not confined within a hole but not so strong as to dislodge the deposited solder balls. The air knife 94 pushes the balls under a flap, which flap acts as a one-way gate to prevent solder balls from rolling back onto the stencil 80. The solder balls collect on the back edge of the stencil 80 where they are sucked up by an overhead vacuum duct. From there the solder balls are conveyed to a collection vessel were all solder balls are separated from the airstream and stored for later reuse.

A schematic representation of a ball brush head 90 and the solder ball mount module 18, is represented in FIG. 7A showing a funnel 23 which drops solder balls SB onto a perforated primary distribution plate 25 through which solder balls drop onto secondary distribution plates 27 and 29. Beneath the secondary distribution plates 27 and 29 there is shown the perforated stencil 31. Stencil 31 is shown above a wafer "W" arranged on the support chuck 33, the wafer W having arrangement of pads 35 thereon. A sweeping arrangement 96 is schematically represented as part of the ball brush head 90 shown in FIG. 8.

Different processes may use solder balls of different sizes and compositions, so avoiding cross-contamination is critical. Each type of solder ball has a dedicated reservoir, brush and collection vessel. These components may be mechanically and/or electronically keyed so that components for use with different solder balls cannot be mixed.

Figure 9A:
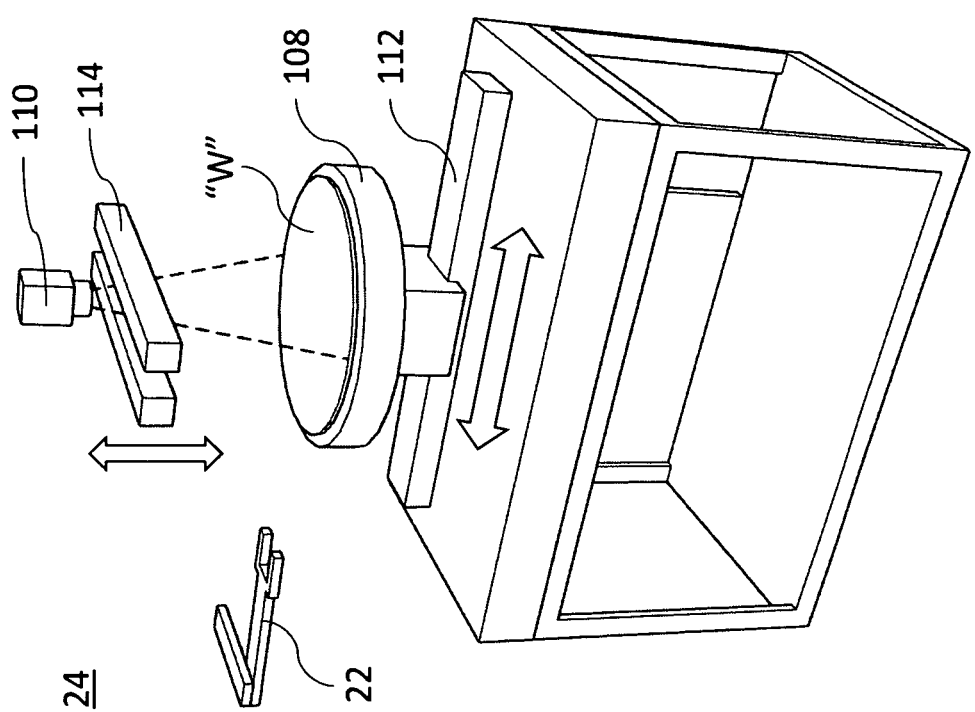
FIGS. 9A, 9B and 9C are perspective and side elevational views respectively, of an inspection/repair module of the present assembly whereby the wafer is inspected to make sure that all solder balls are correctly positioned on a wafer before being reflowed, wherein a line scan camera located in the upper portion of the inspection module looks downwardly upon the wafer on the support chuck so as to capture an image of the entire wafer for computer analysis.
Figure 9B:
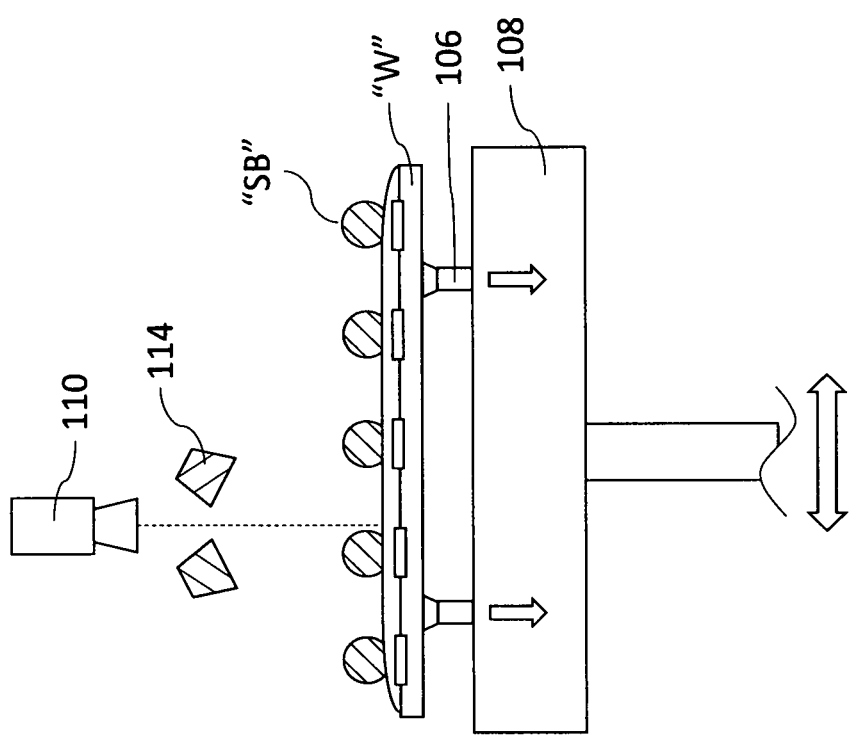

An inspection/repair module 24, first shown in FIG. 9A is utilized to inspect the wafer "W" after ball placement thereon, to make sure that all solder balls are correctly positioned before being reflowed. The robot 22 loads a wafer "W", as shown in FIG. 9A with mounted solder balls SB thereon onto a support pin arrangement 106, with vacuum cups thereon, as shown in FIG. 9B. Once the pin arrangement 106 supports the wafer "W", they move down, driven by a pneumatic actuator and recess into the vacuum support chuck 108 as shown in FIG. 9B. The support plate 108 contains several independently controlled sets of vacuum channels or zones, which grip the wafer once the support pins 106 drop therefrom. A linescan camera 110, shown in FIG. 9A is located in the upper portion of the inspection module 24 and looks downwardly, as represented in FIG. 9A. The support chuck 108 and wafer are translated across the field of view of the linescan camera 110 so as to capture an image of the entire wafer "W". The support chuck 108 is actuated by a computer-controlled precision ball screw 112 and may be illuminated by an arrangement of artificial light sources 114. The wafer images are automatically analyzed to identify defects such as missing solder balls, extra solder balls, or solder balls which are misaligned with respect to the wafers, those wafers which pass inspection move on to reflow module 20 while those which fail inspection are either immediately repaired in the inspection/repair module 24 or stored in a buffer station for later rework.

Figure 9C:
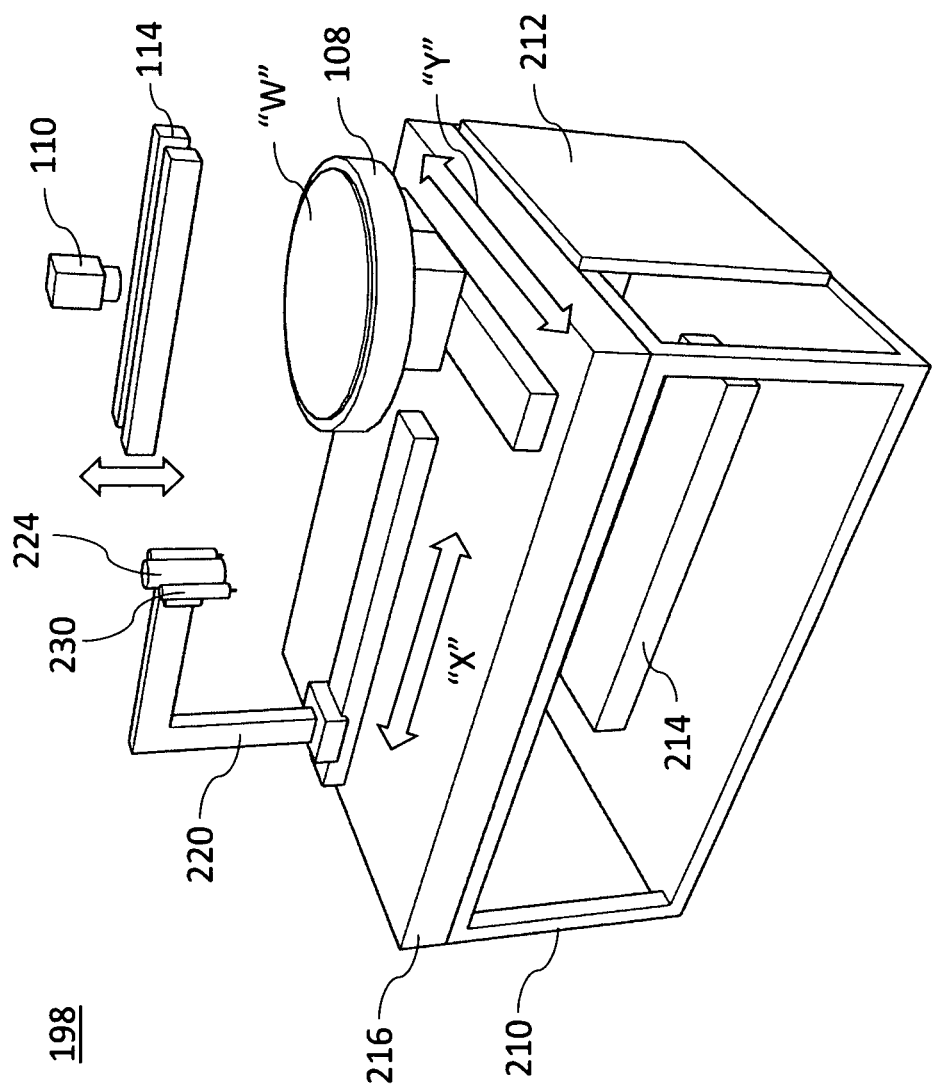

Such an inspection/repair module 24 is shown in FIG. 9C which comprises a base frame 210 supporting a facilities panel 212, a plurality of controls 214, a granite inspection slab 216 mounted on the base frame 210, a pick and place arm 220 mounted for movement in an X direction, vacuum support chuck 108 arranged for Y direction movement on the granite inspection slab 216, and an inspection camera assembly 110. A movable arrangement of artificial light sources 114, is shown in its up position, over the vacuum support chuck 108. The inspection light assembly 114 when in the down position provides light for the inspection camera assembly 110 [200] to view a wafer "W" on the vacuum support chuck 108. The vacuum support chuck 108 moves the wafer under the camera assembly 110 allowing an image of the entire wafer to be generated. Locations of any missing solder balls and of any extra or misplaced solder balls are identified from this image and its coordinates noted within the control computer system associated with the facilities panel 212. The inspection lights 114 may be moved into the up position allowing the pick and place arm 220 move over the wafer W on the vacuum support chuck 108. The pick and place assembly as a needle hub arrangement 230 which includes a vacuum arrangement. As the pick and place assembly 220 hovers over the wafer "W", it removes any misplaced solder balls and disposes of them.

The inspection lights 114 are moved into an up position allowing the pick and place assembly 220 to move in and over the wafer "W". By hovering over the wafer, the pick and place assembly 220 may be utilized to replace the solder balls. First, it removes any misplaced solder balls and disposes of them. Next the pick and place assembly 220 adds solder balls to the wafer applications which have been determined to be missing. The pick and place assembly 220 can reach any place on the wafer by utilizing both linear X and Y Drive movement. In between either of these functions it is possible to use the pick and place camera 224, mounted between actuators to directly view and confirm the placement or removal of a single solder ball. This is important during testing. When the wafer is repaired the pick and place assembly 220 will move out of the way, to the left as shown in FIG. 9C. Finally, the inspection light assembly 114 will move down allowing the inspection camera 110 and the vacuum support chuck 108 to create a second image of the wafer. If no errors are found the wafer is removed from the inspection/repair station 24 transferred to the reflow module 20 by the robotic arm 22, and another wafer may be moved in for repair.

Figure 10:
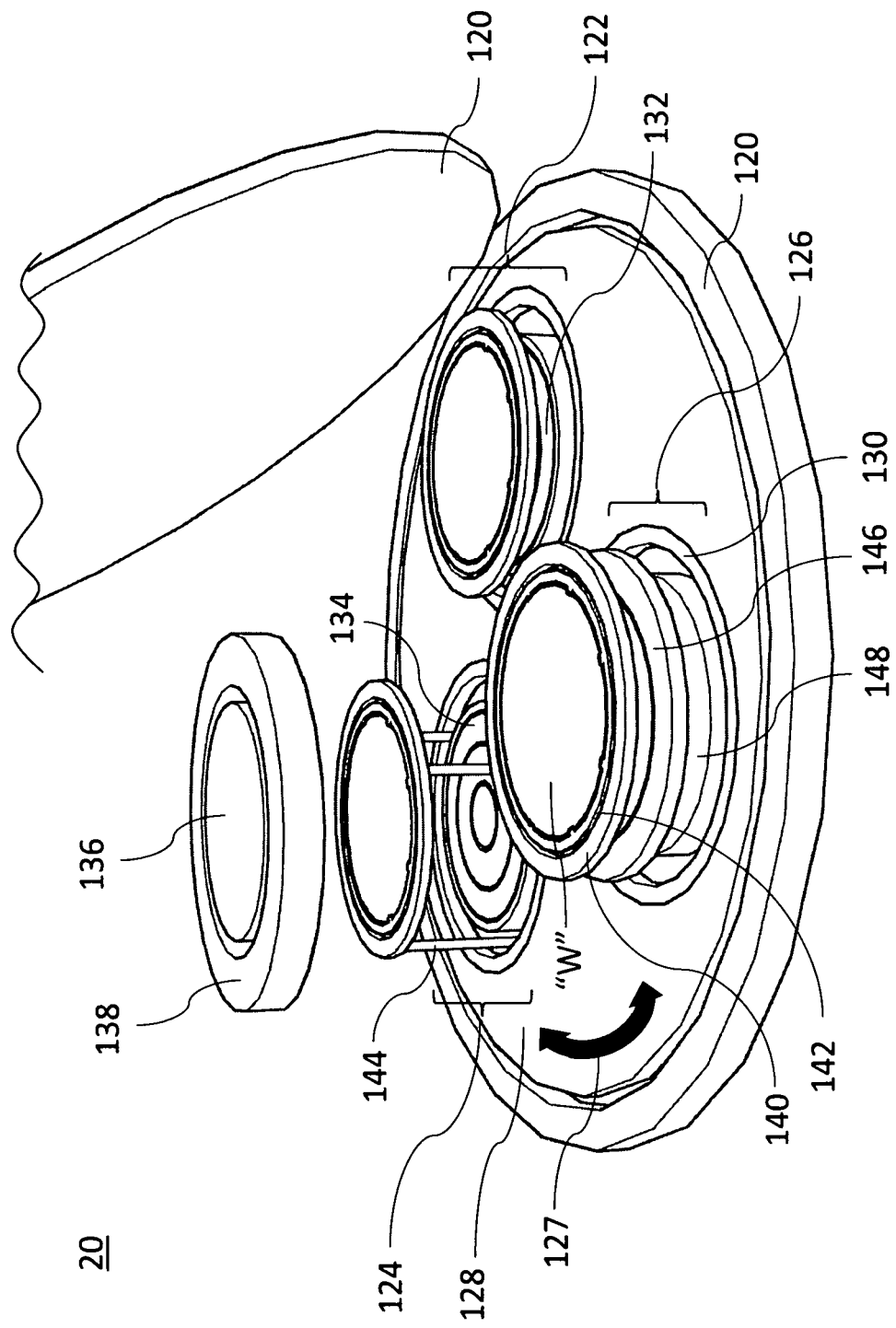
FIG. 10 is a perspective view of an open reflow module which comprises a chamber with three stations, a load lock station, a reflow station, and a warpage management station wherein a wafer is moved station to station within the chamber by a rotating carrier disc.

The reflow module 20 shown and discussed extensively in co-pending application Ser. No. 15/998,295, with its own reference numbers, is incorporated herein by reference, and presently shown consists of an open chamber 120, as shown in FIG. 10, with three stations: the load lock or first station 122, a reflow or second station 124, and a warpage management station 126. The figures of FIG. 10 shows a reflow module open. During processing, the chamber 120 is closed and sealed to the ambient environment. Wafers are moved from station to station within the chamber 120 by a rotating carrier disc 128 whose motion is indicated by arrow 129 in FIG. 10. The disc 128 has multiple spots for serial wafer processing. Each spot holds a carrier ring 130 as shown in FIG. 10 and a support ring 140, also shown in FIG. 10 wherein the wafer "W" sits within the support ring 140. To process wafers, a clamp ring 142 shown in FIG. 10 may also be used wherein the clamp ring 142 holds the wafer flat during processing within the reflow chamber 120. The outer edge of the wafer is sandwiched between the clamp ring 142 in the support ring 140 forming a temporary annular hold down while the wafers in the reflow chamber 120.

The load lock or first station 122 of the reflow module 20 accepts a new wafer wherein a load lock vacuum support chuck 132 and it's baseplate, are raised together by actuating a primary pneumatic cylinder. Mechanism detaches the clamp ring 142 from the support ring 140 to an upper position. A secondary pneumatic cylinder, is an actuated to lower the vacuum support chuck 132 with respect to its base plate, thus exposing the support pins similar to the arrangement shown in FIGS. 4 and 9B. The load lock door is opened by pneumatic actuators which translate and raise the door. The wafer is loaded by the robot and gripped by vacuum cups on the tips of the support pins. The vacuum support chuck 132 is raised and engages the wafer. The vacuum zones on the chuck 132, previously described, turn on and hold the wafer flat. A lowering mechanism lowers the clamp ring 142 and locks it into the support ring 140. The mechanism may also provide additional downward force with the clamp ring 142 in coordination with the support chuck 132 to assist in flattening the wafer. This may be needed in cases where vacuum is not sufficient to flatten the wafer. With the baseplate of the vacuum support chuck 132 up and [in] the load lock door closed a sealed environment is created. After the wafer is loaded, the load lock station 122 is purged with nitrogen to create an oxygen free atmosphere. The wafer "W" is thus lowered back into the carrier disc 128 for rotative advancement to the second station 124.

The reflow station or second station 124 of the reflow module 20 contains three computer-controlled heating elements: a bottom heater 134, a top heater 136 and a ring heater 138 are shown in FIG. 10. The primary purpose of the bottom heaters 134 is to conductively heat a wafer "W" by making direct contact with the wafer assembly. The wafer assembly here consists of the wafer, the support ring 140 and the clamp ring 142. The top heater 136 is used for more gradual convective heating of the wafer within the tower— the tower being the portion of the reflow station above the disc. The ring heater 138 is used to prevent thermal edge losses and improve the temperature uniformity of the wafer. A temperature gradient exists between the top and bottom heaters 136 and 134. The wafer position at different heights within the tower determines its rate of convective heating i.e. temperature that can be controlled. A hot wall conducts heat from the top heater in the ring heater and creates a more stable and gradual temperature gradient in the tower. The hot wall part may be the same piece which supports and transfers heat from the top heater 138.

After the wafer is indexed from the load lock 122 into the reflow station 124, it must be preheated. Preheating is most effectively accomplished by convectively heating the wafer in the tower, in proximity to the top heater 136. Though the top heater 136 can be set to any temperature, it will normally be set significantly higher than the bottom heater 134. Therefore, the higher the wafers positioned in the reflow station 124, the hotter its surroundings become, and the faster it heats up. Elevator pins 144, driven by a servo motor, lift the wafer assembly and controls its height. The temperature sensors in the support ring contact the wafer and precisely monitor its temperature in real time. The combination of wafer temperature monitoring and wafer height control afford the user great control over the temperature profile of the wafer. At its highest position, the support ring 140 contacts a hard stop, mounted to the top heater 136. The stop prevents the wafer assembly from directly contacting the upper portion of the tower, preventing damage to both the tool and the wafer. The stop also conducts heat from the top heater 136 to the support ring 140, which heats the ring quickly. Due to its much larger thermal mass, the temperature of the support ring 140 and clamps 142 will lag behind those of the wafer itself, decreasing the temperature uniformity of the wafer. Conductively heating the support ring 140 minimizes the difference in heating rates between the wafer and the support ring 140, thus improving the wafers temperature uniformity. After preheating, the lift pins 144 lower the wafer assembly back into the disc 128. The bottom heater 134 is then raised, driven by a pneumatic member, and contacts the bottom of the wafer and the support ring 140. Contacting the wafer directly, quickly increases the wafer to a uniform steady temperature. At this temperature solder balls on the wafer melt and attach to their respective pads on the wafer. Vacuum channels in the bottom heater 134 may apply a vacuum force to the wafer if needed to help hold a warped wafer flat and improves conductive heating of the wafer both in terms of speed and uniformity. After contacting the wafer for a certain period, the bottom heater 134 drops and the wafer rotatively advances on the disc 128 to the third station 126.

As the temperature of the wafer increases, even before reflow, metal diffusion between the solder balls and the pads because the solder balls to stick to their pads on the wafer, rendering the binder unnecessary. The liquid binder begins to evaporate at elevated temperature, and by the time the wafer leaves the reflow station 124 all of the binder has been evaporated. An oxygen free reducing atmosphere is maintained in the reflow station 124, along with the rest of the chamber 120, to promote oxide removal and solder reflow. The atmosphere is a mixture of nitrogen gas and reducing gas, such as formic acid. Within the reflow station 124 itself, the reducing gas mixture is introduced through holes in the side of the hot wall, and exhausted, along with binder vapor, through holes in and around the top heater 136, and eventually make their way to a reflow station exhaust port. Between the reflow station exhaust in the main tool exhaust, a binder condenser system may be placed in line. This condensing system condenses the binder vapor and removes it from the exhaust stream, preventing any binder vapor from reaching the facilities exhaust system.

The warpage management station 126, that is, the third station of the reflow module 20, shown in FIG. 10, wherein the wafer and wafer assembly enter the warpage management station 126 at a temperature above the temperature of the heater 148 and the vacuum plate 146. The vacuum plate 146 starts out resting on the heater 148 [in] and both are at the same temperature. The plate 146 and heater 148 are each actuated by their own pneumatic cylinders. Plate 146 and heater 148 first move together to contact the wafer. This cools the wafer rapidly and uniformly to below the solder solidification temperature. As with the vacuum support chucks, three zones of vacuum in the plate 146 can apply a vacuum force to the wafer and hold it flat. This improves conduction between the plate 146 and [in] the wafer, especially if the wafer tends to warp. The plate 146 then separates and maintains its back grip on the wafer. Nitrogen gas now flows to the channels on the plate, actively cooling it. The cooling rate may be adjusted by changing the nitrogen flow with a mass flow controller. Keeping the wafer in contact with the plate 146 while it cools, instead of convectively cooling the wafer while suspended freely in the chamber 120, minimizes or even eliminates residual stress on the wafer. This reduces warpage of the wafer when it is later released from the ring clamp 142. A nitrogen showerhead, above the wafer can also convectively cool the wafer with impinging jets of nitrogen gas. After the plate/wafer system is cooled sufficiently, the vacuum releases and the plate 146 separates from the wafer. The wafer now cools exclusively through convection until it leaves the station. While the wafer is cooling, the plate 146 drops and contacts the heater 148 again. This heats the plate 146 back up to the starting temperature in preparation for the next wafer.

Although the pneumatic members are controlled independently, the resulting motions of the plate 146 and heater 148 are coupled to a limited extent. The wafer pneumatic member governs the absolute position of the heater 148, with unique up-and-down positions relative to the chamber 120. The plate pneumatic can effectively be thought of as a plate/heater separator. It does not control the absolute position of the plate 146, rather it dictates whether the plate is positioned above or is in contact with the heater.

The invention claimed is:

1. A unitary wafer assembly arrangement for the application of solder balls onto a wafer substrate for subsequent use in the electronics industry, the wafer assembly arrangement comprising: an arrangement of wafer treatment modules interconnected to and serviced by a central wafer handling robot to provide a unitary system, the modules including a pre-aligner loadport module for receipt of wafers to be treated, a binder module of the application of a fluid binder onto an upper surface of the wafer, a solder ball mount module for the application of a plurality of solder balls onto the wafer, an inspection module including a review analysis, and insertion and extraction arrangement of misap-plied solder balls deposited on the wafer, and a reflow module for the heating and securing the solder balls onto an arrangement of pads on the wafer; collectively identified herewith, wherein the loadport module is arranged for receipt of untreated wafers, the binder module is arranged for holding each wafer by support pin vacuum arrangement during a binder spray deposition and binder cleanup operation; and wherein a pre-alignment operation of the wafer in a loadport and transference operation to a vacuum cup pin support arrangement in the solder wall mount module for optical alignment review by a plurality of cameras, including a solder balls distributing stencil, and including a solder ball distribution reservoir over the stencil for controlled release of solder balls onto a wafer there below, and including improper solder ball and excess binder retrieval means, and a three station reflow module for the heat treatment of the loaded wafer, or final transfer to the loadport for finished wafer collection.

2. The wafer assembly arrangement as recited in claim 1, wherein the fluid binder is applied to the wafer at room temperature or an elevated temperature, by a nozzle arrangement supported on a gantry movably disposed over a wafer supported thereunder, and excessive binder is collected and utilized for a further wafer.

3. The wafer assembly arrangement as recited in claim 2, wherein a plurality of solder balls are disposed as an array, onto a spaced pattern of solder ball engagement locations on the wafer after the solder balls having been filtered through a vertical array of foraminous solder ball alignment plates movably disposed above the wafer.

4. The wafer assembly arrangement as recited in claim 3, wherein an air knife is driven transversely across the array of solder balls on the surface of the wafer so as to displace any extraneous solder balls from the surface of the wafer.

5. The wafer assembly arrangement as recited in claim 4, wherein any extraneous solder balls are passed to a one-way channel for collection and subsequent reuse on a further wafer.

6. A wafer assembly arrangement for the application of solder balls onto a wafer substrate for subsequent use in the electronics industry, the wafer assembly arrangement comprising: an arrangement of individual wafer treatment modules interconnected to and serviced by a central wafer handling robot for moving the wafers from module to module, the modules including a pre-aligner module for receipt of wafers to be treated, a binder module of the application of a fluid binder onto an upper surface of the wafer, a solder ball mount module for the application of a plurality of solder balls onto the wafer, a reflow module for the heating and securing the solder balls onto an arrangement of pads on the wafer, and an inspection module with a review and analysis of solder balls deposited upon the wafer, wherein the processing comprises: loadport module for receipt of the untreated wafers, the binder module for holding each wafer by a support pin vacuum arrangement during a binder spray deposition and binder cleanup operation; a pre-alignment of the wafer in a loadport and transference to the vacuum cup pin support arrangement in the solder ball mount module for optical alignment review by a plurality of cameras, including a solder ball distributing stencil, a solder ball distribution reservoir over the stencil for controlled release of solder balls onto the wafer there below, improper solder ball and excess binder retrieval means, a three station reflow module for the heat treatment of the loaded wafer, and finally transfer to the loadport for finished wafer collection.

7. The wafer assembly arrangement as recited in claim 6, wherein the fluid binder is applied to the wafer by a nozzle arrangement supported on a primary computer-controlled gantry movably disposed over a wafer supported thereunder.

8. The wafer assembly arrangement as recited in claim 7, wherein a plurality of solder balls are disposed as an array, onto a spaced pattern of solder ball engagement locations on the wafer after the solder balls having been fallen through a vertical array of foraminous solder ball alignment plates vibratively disposed above the wafer.

9. The wafer assembly arrangement as recited in claim 8, wherein an air knife, supported on the primary gantry, is driven transversely across the array of solder balls on the surface of the wafer so as to displace any extraneous solder balls from the surface of the wafer.

10. The wafer assembly arrangement as recited in claim 9, wherein any extraneous solder balls are passed under a one-way valve to a one-way channel for collection and subsequent reuse on a further wafer.

\* \* \* \* \*